US010560037B2

(12) United States Patent
Nikolov et al.

(10) Patent No.: US 10,560,037 B2
(45) Date of Patent: Feb. 11, 2020

(54) APPARATUS AND METHOD FOR CONTROL OF MULTI-INVERTER POWER CONVERTER

(71) Applicant: GE Global Sourcing LLC, Norwalk, CT (US)

(72) Inventors: Emil Nikolov, Erie, PA (US); Jeffrey Richard Zimmerman, Erie, PA (US)

(73) Assignee: GE Global Sourcing LLC, Norwalk, CT (US)

( * ) Notice: Subject to any disclaimer, the term of this patent is extended or adjusted under 35 U.S.C. 154(b) by 0 days.

(21) Appl. No.: 16/291,413

(22) Filed: Mar. 4, 2019

(65) Prior Publication Data

US 2019/0222140 A1    Jul. 18, 2019

Related U.S. Application Data

(63) Continuation of application No. 15/319,042, filed as application No. PCT/US2015/037034 on Jun. 22, 2015, now Pat. No. 10,263,536.

(Continued)

(51) Int. Cl.
*H02M 7/493* (2007.01)
*H02M 7/00* (2006.01)
(Continued)

(52) U.S. Cl.
CPC ......... *H02M 7/493* (2013.01); *H02M 1/0845* (2013.01); *H02M 7/003* (2013.01);
(Continued)

(58) Field of Classification Search
CPC ......... H02M 2001/0012; H02M 1/084; H02M 1/0845; H02M 7/003; H02M 7/493
See application file for complete search history.

(56) References Cited

U.S. PATENT DOCUMENTS

| 5,485,350 A | * | 1/1996 | Hecht | H02B 1/56 |
| | | | | 165/80.3 |
| 5,886,508 A | * | 3/1999 | Jutras | G05F 1/577 |
| | | | | 323/267 |

(Continued)

FOREIGN PATENT DOCUMENTS

WO    WO-2009017296 A1 *  2/2009  ............. H02K 5/225

*Primary Examiner* — Fred E Finch, III
(74) *Attorney, Agent, or Firm* — Christopher R. Carroll; The Small Patent Law Group, LLC

(57) ABSTRACT

A control apparatus includes a control logic circuit that is configured to generate control signals for controlling at least two inverters (e.g., 3-phase inverters) that are coupled in parallel. The control logic circuit is configured to sample output currents present in common load terminals of the inverters, and to compare the sampled currents to generated current references. The output currents may be sampled, and/or the current references generated, at a fixed rate. Errors between the sampled currents and current references are evaluated against hysteresis dead bands around the current references. The control signals are generated based on (i) retrieved modulator output values for a selected one of the inverters and (ii) the errors as evaluated against the hysteresis dead bands. The control logic circuit may implement first and second counters for coordinating the current reference generation, sampling the output currents, retrieving the modulator output values, etc.

20 Claims, 5 Drawing Sheets

Related U.S. Application Data

(60) Provisional application No. 62/014,907, filed on Jun. 20, 2014.

(51) Int. Cl.
    *H02M 1/084*     (2006.01)
    *H03K 19/173*     (2006.01)
    *H02M 1/00*     (2006.01)

(52) U.S. Cl.
    CPC ... *H03K 19/173* (2013.01); *H02M 2001/0048* (2013.01); *Y02B 70/1491* (2013.01)

(56) References Cited

U.S. PATENT DOCUMENTS

| | | | | |
|---|---|---|---|---|
| 6,118,680 | A * | 9/2000 | Wallace | H02M 7/493 363/71 |
| 10,263,536 | B2 * | 4/2019 | Nikolov | H02M 7/493 |
| 2004/0262057 | A1 * | 12/2004 | Kumar | H02M 7/493 180/65.225 |
| 2009/0185400 | A1 * | 7/2009 | Okui | H02M 7/493 363/71 |
| 2009/0231811 | A1 * | 9/2009 | Tokuyama | H01L 23/36 361/699 |
| 2011/0163706 | A1 * | 7/2011 | Miura | H02M 7/53875 318/400.27 |
| 2012/0235614 | A1 * | 9/2012 | Tallam | H02M 5/4585 318/400.27 |
| 2013/0044434 | A1 * | 2/2013 | Sharaf | H05K 7/20927 361/702 |
| 2013/0134917 | A1 * | 5/2013 | Kaneko | H02M 7/493 318/490 |
| 2013/0342149 | A1 * | 12/2013 | Masuda | H02P 3/02 318/479 |
| 2014/0203756 | A1 * | 7/2014 | Kajiura | H02M 7/493 318/812 |
| 2014/0241016 | A1 * | 8/2014 | Ho | H02M 7/493 363/40 |
| 2014/0345492 | A1 * | 11/2014 | Fujito | H02P 27/06 105/61 |
| 2017/0187277 | A1 * | 6/2017 | Szczesny | H02M 1/088 |
| 2017/0302190 | A1 * | 10/2017 | Ikarashi | H02M 7/493 |

\* cited by examiner

APPARATUS AND METHOD FOR CONTROL OF MULTI-INVERTER POWER CONVERTER

CROSS-REFERENCE TO RELATED APPLICATIONS

This application is a continuation of U.S. patent application Ser. No. 15/319,402, filed 16 Dec. 2016, which is a National Stage Entry of U.S. Patent Application No. PCT/US15/37034, filed 22 Jun. 2015, which claims the benefit of U.S. Provisional Application No. 62/014,907, filed 20 Jun. 2014. The entire disclosures of these applications are incorporated herein by reference.

FIELD

Embodiments of the invention relate generally to power converters. Other embodiments relate to control of power converters incorporating multiple discrete inverters.

BACKGROUND

Solid-state power converters often are used to provide high voltage current from generators or alternators to electrical loads such as vehicle motors. Such power converters include semiconductor power switches to commutate current and may also include capacitive and/or inductive elements to assist in adjusting voltage. It will be appreciated that power converters also can be used in many other settings.

Generally, power converters are operated by applying alternately two different gate voltage levels to individual semiconductor power switches via corresponding gate drive units. One (higher) gate voltage forward-biases or drives a switch, whereas the other (lower or reversed) gate voltage turns off the switch. Semiconductor power switches are limited, however, in how much current they can conduct. While forward-biased, each power switch conducts significant current in a forward direction at a relatively small voltage drop across the switch. Despite the relatively low voltage across the forward-biased power switch, resistive heating can occur. As a result, for large electrical loads, it can be necessary to operate a power converter with plural switches connected in parallel. Often such a parallel power converter will be arranged in modules, each module being an inverter in itself. The modular inverters then are coordinated by a control system.

Although durability is a consideration in semiconductor switch design, electrical design constraints entail that the various layers of the semiconductor power switches are fabricated from materials having differing thermal properties, in particular, differing coefficients of thermal expansion. Therefore, over time, thermal stress can potentially cause delamination, debonding of terminals, or fatigue cracking. Thermal stress can also cause electrochemical failures such as current filamenting and Kirkendall void formation.

Thermal stress effects can be rendered more predictable, and can be mitigated, by maintaining the heating/cooling cycle within a design envelope defined to minimize temperature swings despite continual on/off cycling.

Often, switch electrical connection points are split into multiple terminals to allow for high currents. An example of this is when a power converter for large current loading is constructed of multiple inverters connected in parallel (a multi-inverter power converter or "multi-converter"). Multi-converters present a known chaotic system, in which small deviations from synchronous switching of the parallel inverters can lead to large fluctuations in electrical performance and current flow. Indeed, synchronization presents a key challenge for using devices in parallel—even a few microseconds of timing offset can create significant excess current flow in parts of a circuit and can drive component failures.

In view of the above, it may be desirable to improve synchrony of switching among the multiple inverters in a multi-converter, in order to mitigate unexpected circuit oscillations.

BRIEF DESCRIPTION

In an embodiment, a control apparatus (e.g., for controlling a multi-inverter power converter) includes a support structure (e.g., circuit board and/or housing), a control logic circuit (e.g., FPGA and/or processor) attached to the support structure, and a control output terminal attached to the support structure. The control logic circuit is configured to generate, for output through the control output terminal, control signals for controlling at least two inverters that are coupled in parallel. The support structure, including the control logic circuit and control output terminal attached thereto, is removably detachable as a single unit from a machine frame to which the at least two inverters are attached. In this manner, according to aspects of the invention, a common control apparatus (i.e., single card controller) is configured to control plural parallel-connected inverters.

In another embodiment, a control apparatus (e.g., for controlling a multi-inverter power converter) includes a support structure (e.g., circuit board and/or housing), a control logic circuit (e.g., FPGA and/or processor) attached to the support structure, and a control output terminal attached to the support structure. The control logic circuit is configured to generate, for output through the control output terminal, control signals for controlling respective pluralities of semiconductor switches of at least two inverters that are coupled in parallel. Outputs of the at least two inverters are connected to at least one common load terminal. The control logic circuit is configured to generate, at a fixed sample rate, at least one sampled output current of at least one output current respectively present in the at least one common load terminal. The control logic circuit is configured to generate the control signals based at least in part on the at least one sampled output current in comparison to at least one reference current value. The at least one reference current value may be generated at the fixed sample rate, and according to an aspect of the invention, generating (creating and/or updating) the references and the sampled output currents at the fixed sample rate allows for control over the inverter switching frequency. This may facilitate single controller control of multiple, parallel-connected, high-power inverters, for example.

BRIEF DESCRIPTION OF THE DRAWINGS

The present invention will be better understood from reading the following description of non-limiting embodiments, with reference to the attached drawings, wherein below.

DETAILED DESCRIPTION

Figure 1:
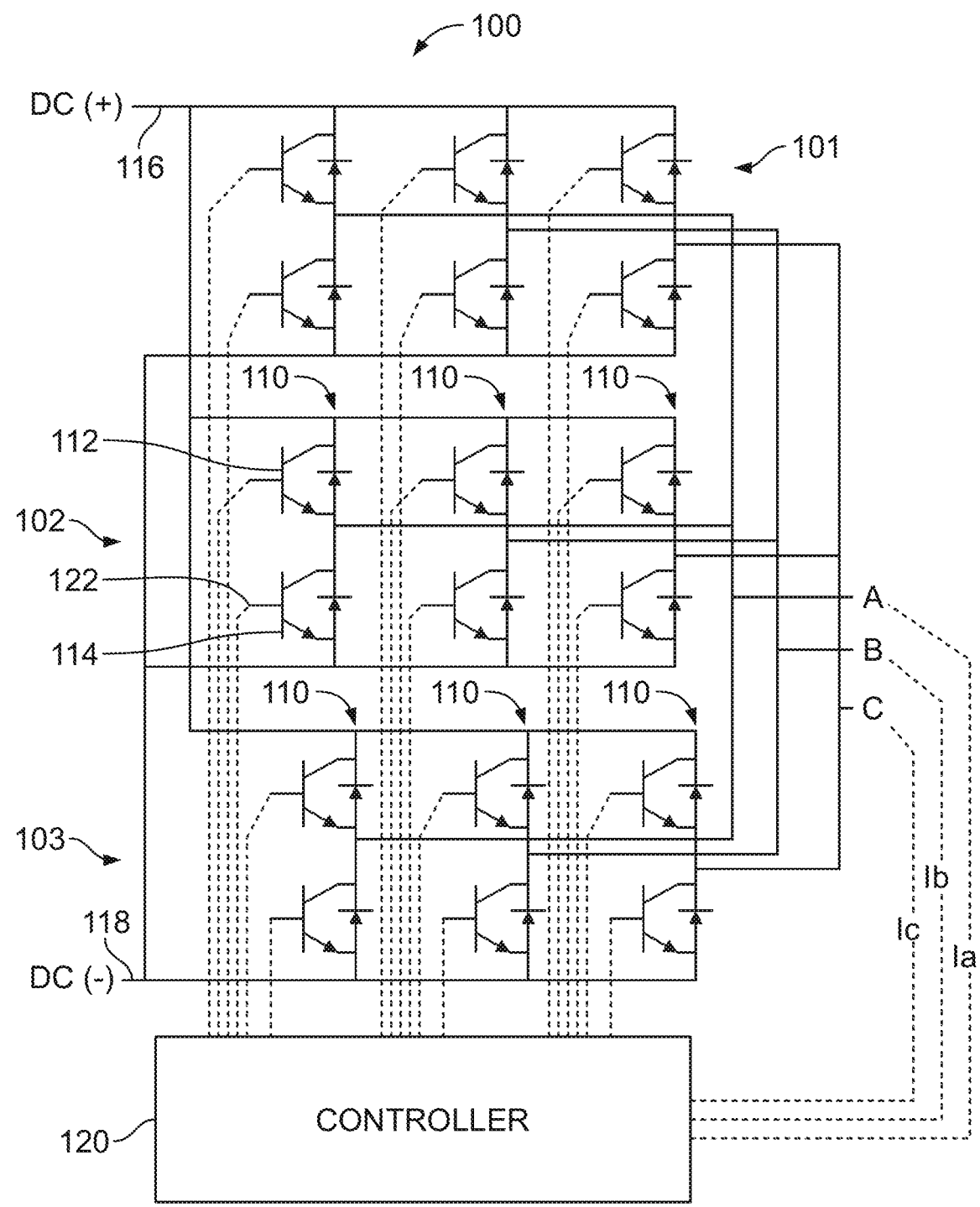
FIG. 1 shows a multi-converter and associated controller or control apparatus, according to an embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the invention are described with respect to multi-converters, embodiments of the invention also are applicable for use in synchronizing parallel semiconductor switches, generally.

FIG. 1 shows a multi-converter 100 that includes plural three-phase inverters 101, 102, 103 (collectively, "101, etc."). In other embodiments, the multi-converter 100 could include additional inverters, which need not be three-phase in configuration. Each inverter includes plural phase legs 110, and each phase leg includes a high phase semiconductor switch 112 that is connected between a DC+ (positive DC supply) rail 116 and a load terminal A, B, or C. Each phase leg 110 also includes a low phase switch 114 that is connected in series with the high phase switch between the load terminal A, B, or C and a DC− (negative/ground DC supply) rail 118. The multi-converter 100 is controlled by an integrated controller 120, which sends drive voltages to gate terminals 122 of the several switches 112, 114 in order to commutate DC+ and DC− voltage to the load terminals A, B, and C. For example, in a three-phase inverter, as shown, the phase legs may be alternately switched to convert DC power to three-phase AC power, e.g., the outputs of the three legs may be AC waveforms phase shifted 120 degrees from one another. The inverters 101, etc. are connected in parallel, meaning that instead of each being connected to a separate load, the outputs of the phase legs are connected to common three load terminals A, B, C. The integrated controller 120 senses load terminal currents Ia, Ib, Ic and adjusts timing of the drive voltages in order to synchronize the various switches 112, 114 and maintain the load terminal currents at desired reference values, in a manner further discussed below with reference to the multi-converter control system shown in FIG. 3.

Figure 2:
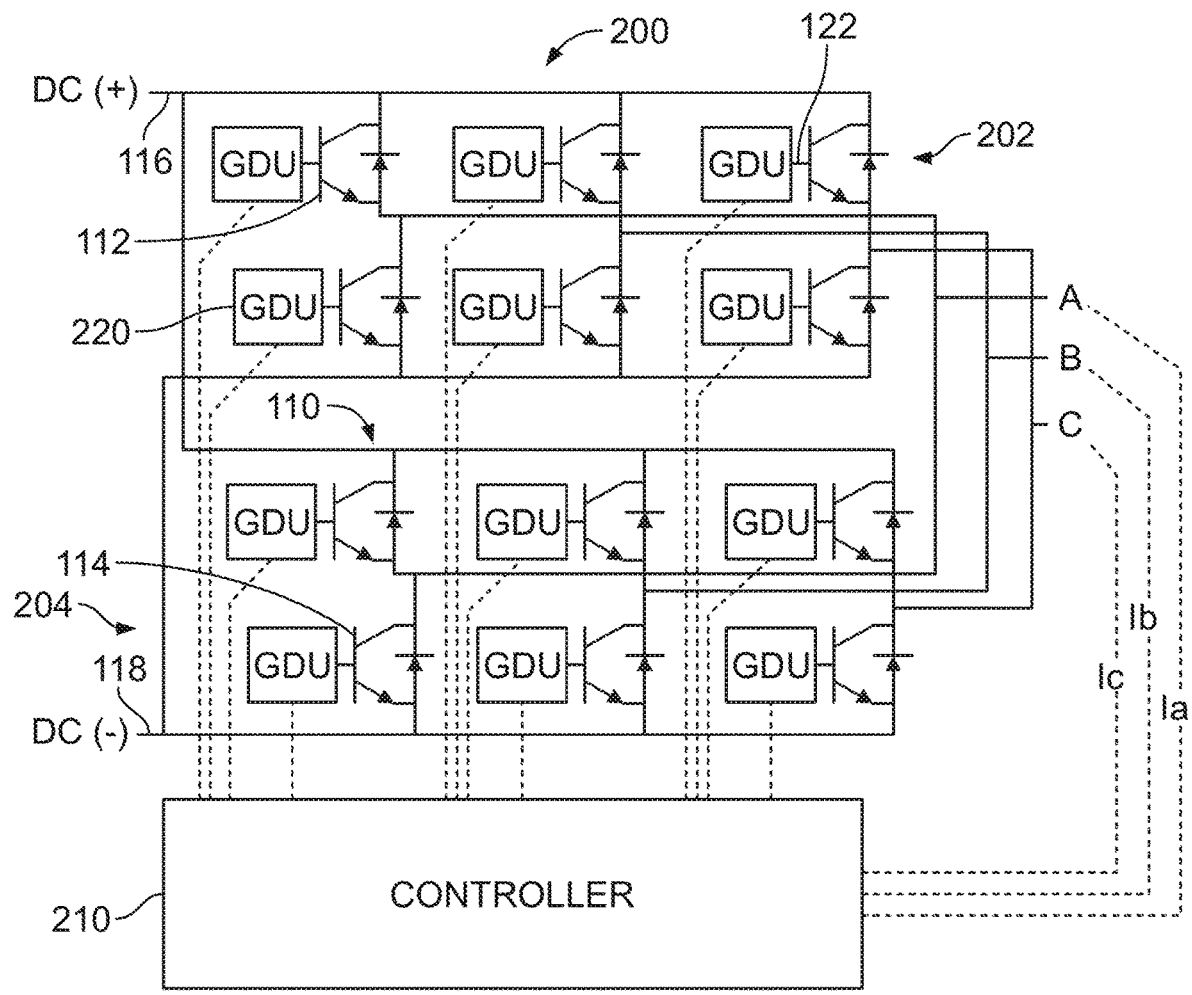
FIG. 2 shows a multi-converter with a controller and gate drive units, according to another embodiment.

FIG. 2 shows a different multi-converter 200 that includes plural three-phase inverters 202, 204 being driven by a central controller 210 that modulates gate drive units ("GDU") 220. Each inverter 202 or 204 includes plural phase legs 110, and each gate drive unit 220 sends drive voltage to the gate terminal 122 of its respective switch 112 or 114. The central controller 210 senses load terminal currents Ia, Ib, Ic, and modulates the gate drive units 220 to maintain the load terminal currents at or near desired reference values, according to a multi-converter control system 300 as further discussed below with reference to FIG. 3. As should be appreciated, whereas the embodiment of FIG. 1 includes three three-phase inverters in parallel, the embodiment of FIG. 2 includes two three-phase inverters in parallel.

Figure 3:
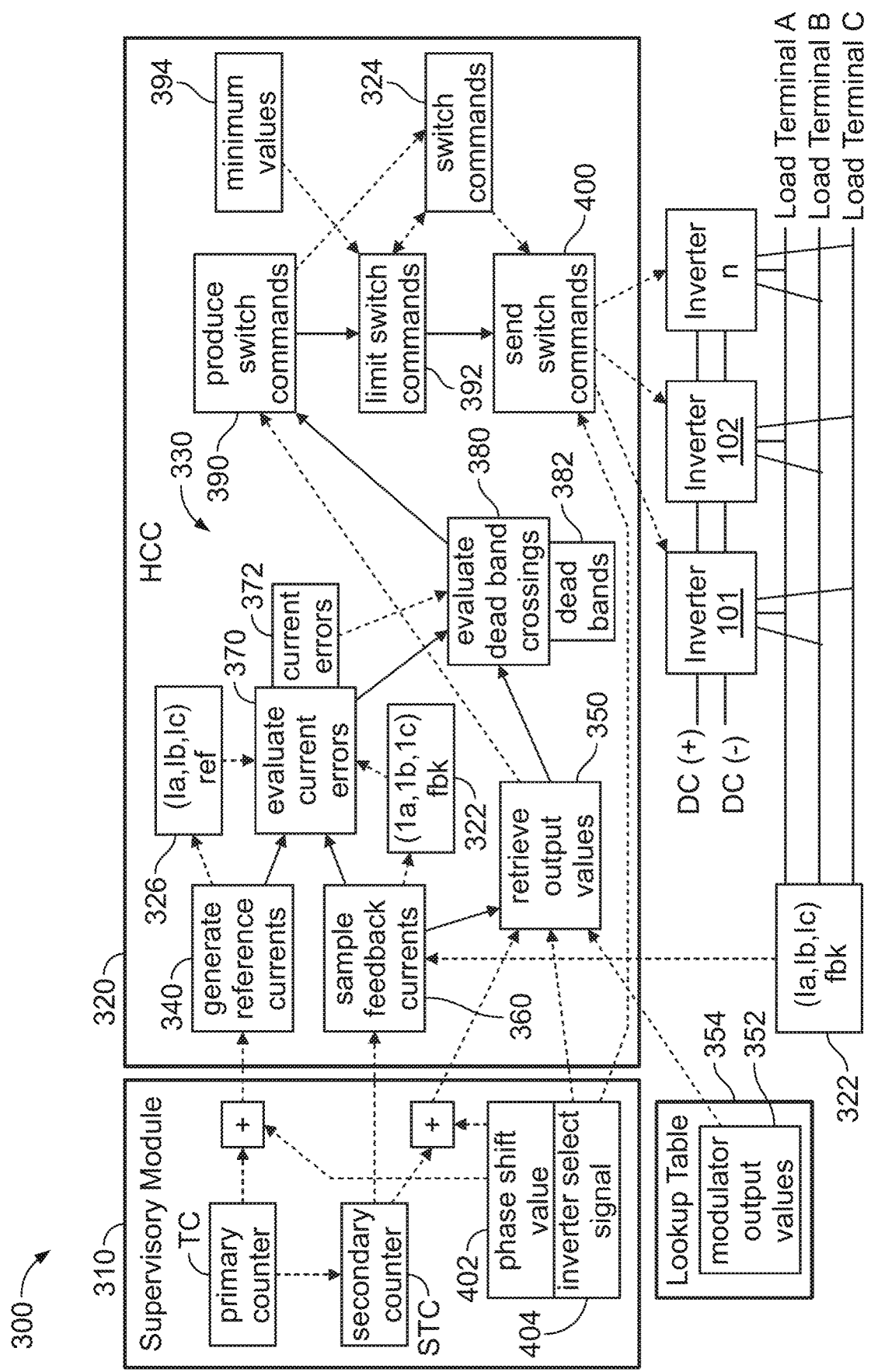
FIG. 3 shows a multi-converter control system, according to aspects of the invention.

In an embodiment, as shown in FIG. 3, a multi-converter control system 300 includes a supervisory module 310, which generates a primary counter TC and a secondary counter STC. The primary counter TC is a fast counter that is triggered at a clock time step of the processor implementing the supervisory module 310. That is, the supervisory module may include a processor, with the fast counter being triggered according to a clock of the processor. The secondary counter STC is a slow counter that is driven by the primary counter TC. For example, the secondary counter STC may increment and loop at predetermined values of the primary counter TC. Alternatively, the secondary counter STC may increment and loop at variable values of the primary counter TC, according to system parameters. The supervisory module 310 feeds the secondary counter STC, along with the primary counter TC, to a waveform generator 320.

The waveform generator 320 implements a hysteresis current control (HCC) process 330 that receives feedback currents 322 from load terminals A, B, C, generates switch commands 324 in response to the feedback currents, and sends the switch commands to the multiple parallel-connected inverters 101, 102, . . . "n" (in this example, n=whole real number greater than or equal to 3, meaning there may be 2, 3, or more inverters) in order to maintain reference values 326 of pulse-width modulated (PWM) current to the load terminals. The switch commands 324 may be drive voltage levels sent directly to gate terminals of individual switches, or they may be on/off durations sent to gate drive units 220 of the individual switches, or they may be modulator settings sent to modulators of the inverters, with the modulators instructing gate drive units to send drive voltages to drive terminals.

The hysteresis current control process 330 uses the primary counter TC as a source to generate 340 the reference currents 326. The HCC process 330 uses the secondary counter STC as a pointer to retrieve 350 modulator output values 352 from a look up table 354, and also as a timer for sampling 360 the feedback currents 322. Thus, only at the same time that the waveform generator 320 retrieves 350 updated modulator output values 352, the waveform generator 320 also samples 360 the feedback currents 322. Concurrently, the waveform generator 320 evaluates 370 current errors 372 between the reference currents 326 and the sampled feedback currents 322, and evaluates 380 whether the current errors 372 cross hysteresis dead bands 382. The waveform generator 320 then produces 390 the switch commands 324 based on the modulator output values 352 and the dead band crossing evaluation 380. After limiting 392 the switch commands 324 to observe minimum values 394 for on, off, and dead times, the waveform generator 320 then sends 400 the switch commands 324.

As shown in FIG. 3, the multi-converter control system 300 can be configured to implement sequentially or concurrently within the waveform generator 320 a plurality of HCC processes 330, which correspond to the plurality of inverters 101, 102, . . . n within the multi-converter 100. In the embodiment shown in FIG. 3, the supervisory module 310 generates a plurality of phase shift values 402 and a plurality of corresponding inverter select signals 404. For temperature control, the various inverters 101, etc. are physically dispersed across the structure of the multi-converter 100. Thus, diverse signal paths connect the waveform generator 320 to each of the inverters. Therefore, the phase shift values 402 compensate for the different signal paths and consequent signal delays between the waveform generator 320 and the switches of the various inverters 101, etc. that correspond to the inverter select signals 404. More specifically, each phase shift value 402 offsets the primary counter TC to create an inverter-specific primary counter TC that then allows the creation of an inverter-specific secondary counter STC. The inverter-specific STC then is used as by the waveform generator 320 for retrieving 350 the modulator output values 352, which are superimposed on a triangular carrier wave to generate a set of firing commands to be sent to the inverter identified by the inverter select signal 404.

Using the primary counter TC together with the inverter-specific phase shifts 402 allows synchronization of the semiconductor switch commands 324 to a sub-microsecond timing. This enhances current sharing, thermal balancing, and load control.

The same control process can also be used on the secondary counter STC, which is the pointer for the lookup table 354. Doing so allows the waveform generator 320 to interleave semiconductor switch commands 324 among the several inverters 101, etc. for even better thermal balance. The inverters would load share and time share, thus limiting overall RMS and power losses.

The multi-converter control system 300 may be implemented in a single card, in which case the separate inverters 101, etc. are driven by interrupt service routines executed on the single card CPU—taking finite amount of time in the order of 30-60 microseconds. This limits synchronization capability to an extent that may be acceptable in many applications, with use of current sharing reactors.

To reduce cost, as well as multi-converter size and complexity, certain embodiments of the multi-converter control system 300 may be implemented across several cards. In particular, time-sharing by interleaved switch commands uses two separate cards to control the inverter firing—in part for redundancy and in part to evade the time constraints mentioned above.

The multi-converter control system 300 may be implemented in a FPGA or an ASIC, or in a processor using software. FPGA implementation of the waveform generator 320 may be used when different ones of the plural inverters 101, etc. require different algorithms for selecting switch commands. In this case, the supervisory module 310 or the waveform generator 320 may recognize the FPGA according to the inverter select signals 404.

Figure 4:
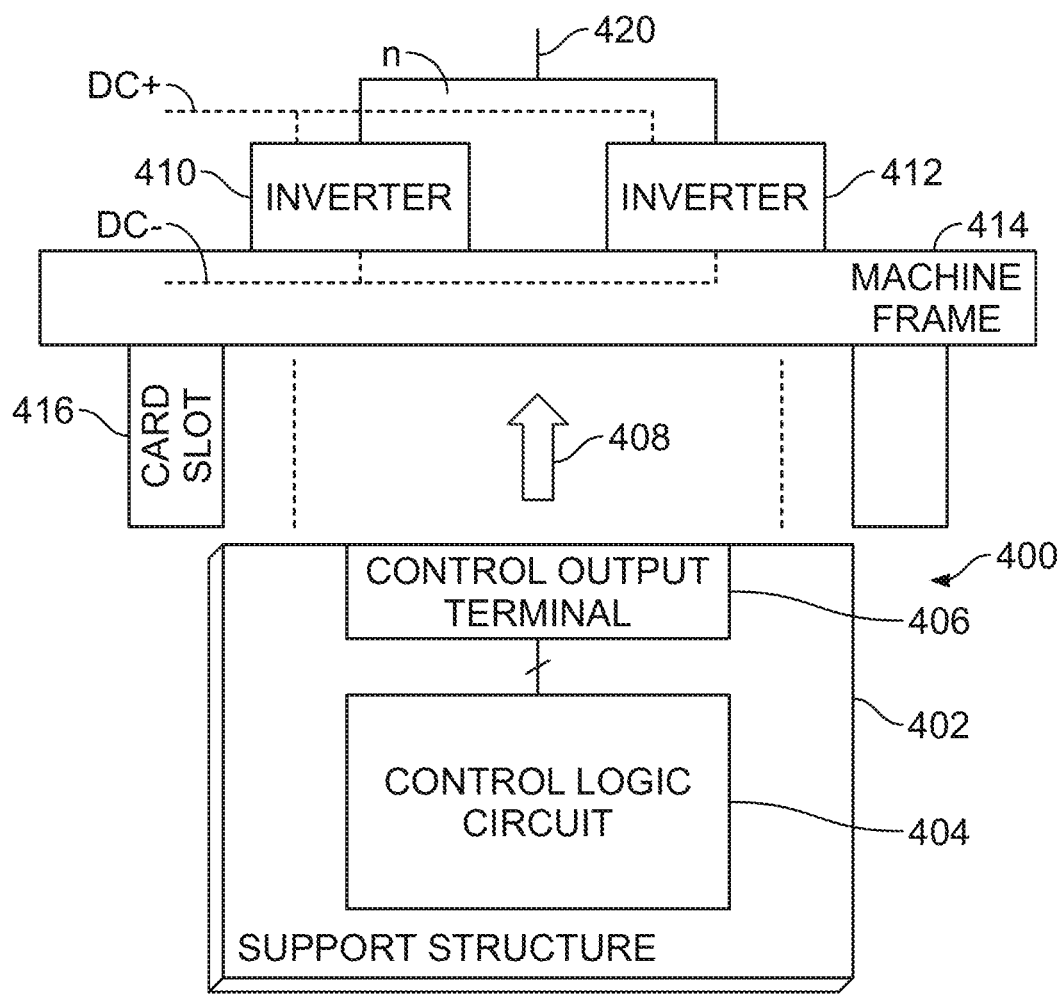
FIG. 4 is a schematic view of a control apparatus, according to an embodiment.

In another embodiment, with reference to FIG. 4, a control apparatus 400 includes a support structure 402, a control logic circuit 404 attached to the support structure, and a control output terminal 406 attached to the support structure. The control logic circuit is configured to generate, for output through the control output terminal, control signals 408 for controlling at least two inverters 410, 412 that are coupled in parallel. The support structure, including the control logic circuit and control output terminal attached thereto, is removably detachable as a single unit from a machine frame 414 to which the at least two inverters are attached. In this manner, according to aspects of the invention, the control apparatus may be configured as a single unit (i.e., single card controller) to control plural parallel-connected inverters.

The support structure may be, for example, a circuit board or other rigid substrate (i.e., a card) to which circuitry can be permanently affixed. Alternatively or additionally, the support structure may include a housing that performs the same purpose, or a stand-alone housing that encloses a card. In an embodiment, the control logic circuit includes all the circuitry necessary for controlling multiple parallel-connected inverters, which is attached to a single card.

In another embodiment, the support structure 402 includes a card that is removably detachable from a card slot 416 of the machine frame 414. In this example, the machine frame may be a card cage. With reference to FIG. 8, the machine frame may be disposed in a vehicle 418, reflecting that in embodiments, the control apparatus is configured to control inverters that power traction motors, vehicle auxiliary loads, etc.

The control output terminal 406 is an electrical bus or the like, including one or more conductors, which establishes an electrical connection between the control logic circuit and the inverters, for the control logic circuit to communicate control signals to the inverters. The control output terminal may include, or be electrically attached to, one or more bus bars, wires, cables, etc. that interconnect the apparatus and the inverters. In an embodiment, the control output terminal is configured to automatically establish a detachable electrical connection between the control logic circuit and the inverters (or busses attached to the frame that are in turn electrically connected to the inverters) when the support structure is attached to the frame. For example, the control output terminal may include plural conductive tabs that are configured to be received in corresponding conductive slots attached to the frame.

As noted above, the inverters may include transistors or other semiconductor switches, which are configured to be switched on and off in a controlled firing pattern (as generated by the control apparatus) to convert one electrical waveform to another, e.g., DC to 3-phase AC. In an embodiment, the semiconductor switches include SiC (silicon carbide) switches (e.g., SiC transistors). SiC switches may have electrical properties that facilitate the use of the control system 300 (or other control systems/apparatuses) as set forth herein) in low power applications, for example.

The control apparatus 400 may be configured similarly as the control system 300 of FIG. 3. According to an aspect, the control architecture of FIG. 3 allows for the level of control accuracy that may be necessary for single-card control of plural high-power, parallel-connected inverters. Additionally or alternatively, the control logic circuit may include one or more FPGA's and/or processors.

Figure 6:
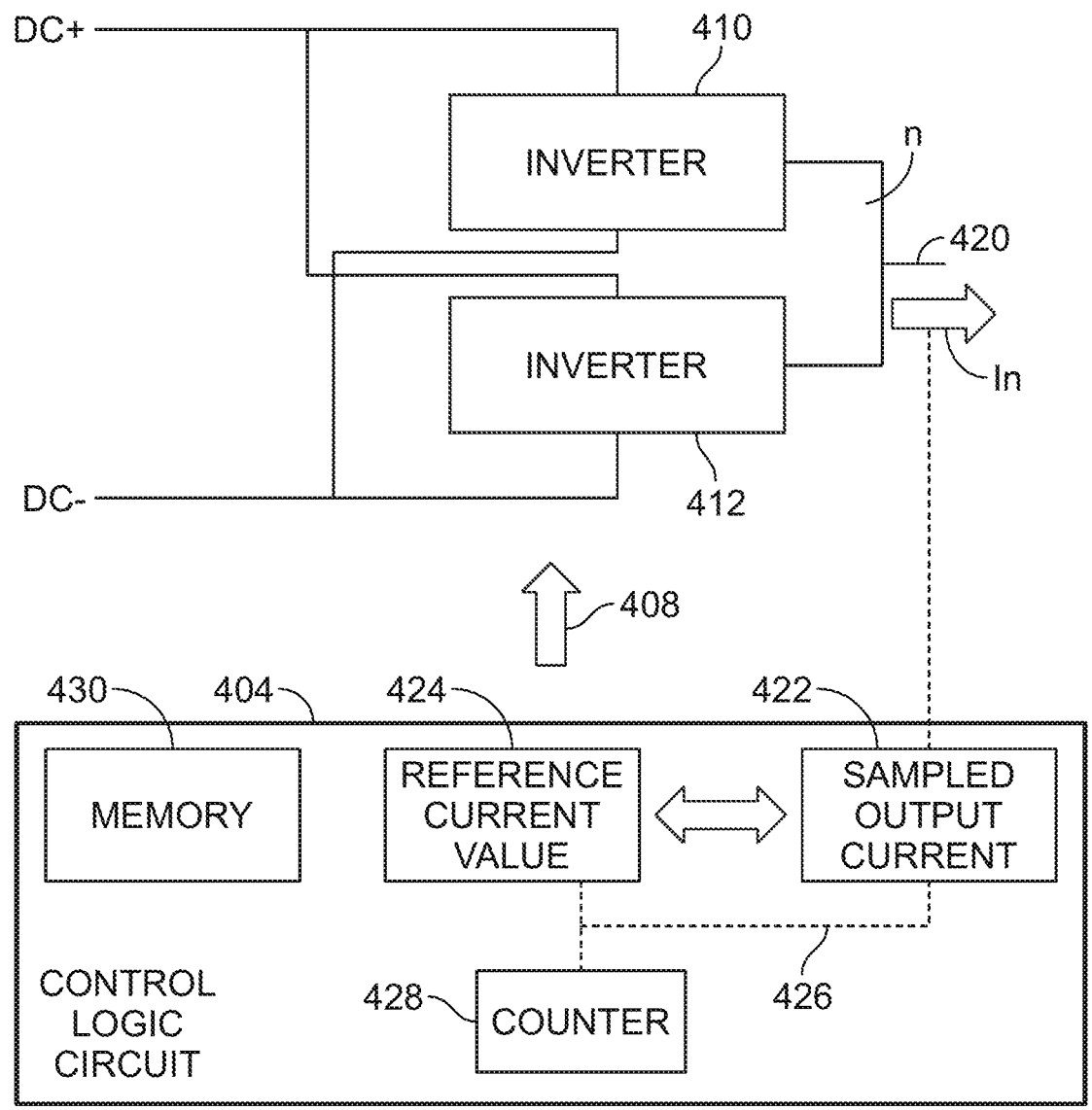
FIG. 6 is a schematic view of a control apparatus, according to another embodiment.

In an embodiment, for example, with reference to FIG. 6, the control logic circuit 404 is configured to generate the control signals 408 as a firing pattern for controlling respective pluralities of semiconductor switches of the at least two inverters 410, 412. Outputs of the at least two inverters are connected to at least one common load terminal 420. The control logic circuit is configured to generate, at a sample rate, at least one sampled output current 422 of at least one output current $I_n$ respectively present in the at least one common load terminal 420. The control logic circuit is configured to generate the control signals/firing pattern based at least in part on the at least one sampled output current 422 in comparison to at least one reference current value 424. According to an aspect, the sample rate may be a fixed sample rate, and the control logic circuit may additionally be configured to generate the at least one reference current value at the fixed sample rate. Additionally, the fixed sample rate may be based on at least one counter output 426 of the control logic circuit, i.e., at least one counter output of at least one counter 428 implemented by the control logic circuit.

In another embodiment, the control logic circuit is configured to generate the firing pattern further based on whether differences between the at least one sampled output current and the at least one reference current value cross one or more hysteresis dead bands, and on one or more modulator output values retrieved from a memory 430. (The modulator output values may be stored as a lookup table, as per FIG. 3.) The control logic circuit may be configured to retrieve the one or more modulator output values based on the counter output(s).

In any of the embodiments herein, each inverter 101, 102, 102, 202, 204, etc. may have an output power of from 10 kW to 3000 kW, reflecting that they may be sized for handling, for example, anything from auxiliary loads (e.g., 10 kW) to vehicle traction motors (e.g., 2200+kW).

Figure 5:
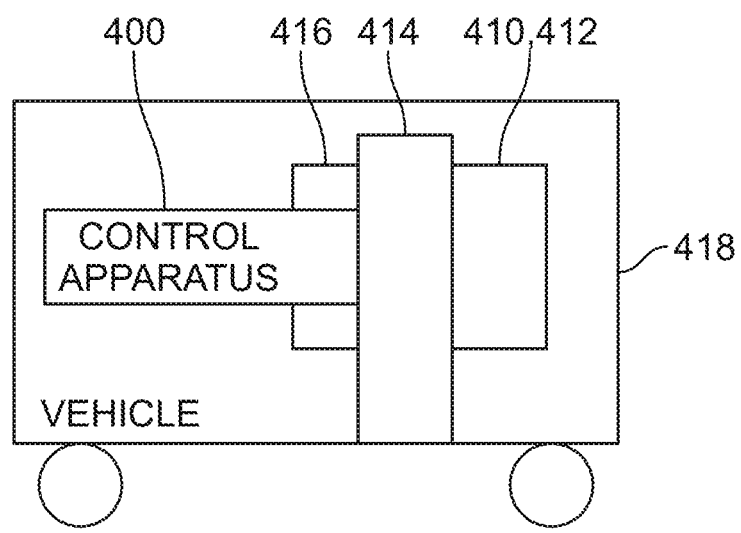
FIG. 5 is a schematic view of an embodiment of the control apparatus in place in a vehicle.

In another embodiment, a control apparatus includes a support structure, a control logic circuit attached to the support structure, and a control output terminal attached to the support structure. (This may be similar to as described above in regards to FIGS. 4-5.) The control logic circuit is configured to generate, for output through the control output terminal, control signals for controlling respective pluralities of semiconductor switches of at least two inverters that are coupled in parallel. (Outputs of the at least two inverters are connected to at least one common load terminal.) The control logic circuit is configured to generate, at a fixed sample rate, at least one sampled output current of at least one output current respectively present in the at least one common load terminal. The control logic circuit is also configured to generate the control signals based at least in part on the at least one sampled output current in comparison to at least one reference current value.

Further, the control logic circuit may be configured to generate the at least one reference current value at the fixed sample rate, and the fixed sample rate may be based on at least one counter output of the control logic circuit.

In another embodiment, the control logic circuit is configured to generate the control signals further based on whether differences between the at least one sampled output current and the at least one reference current value cross one or more hysteresis dead bands, and on one or more modulator output values retrieved from a memory of the control logic circuit.

The control logic circuit may include a first counter and a second counter that is driven by the first counter. Here, the control logic circuit is configured to retrieve the one or more modulator output values and to generate the at least one sampled output current based on an output of the second counter. Also, the control logic circuit is configured to generate the at least one reference current value based on an output of the first counter.

In another embodiment, a multi-converter control apparatus includes at least one processor and is configured to implement a supervisory module and a waveform generator. The waveform generator is configured to produce and send control signals to each of a plurality of inverters in response to feedback currents and inverter select signals. The waveform generator is further configured to sample the feedback currents only at pre-determined intervals based on a counter provided by the supervisory module.

In another embodiment, the control apparatus is configured to adjust the control signals for each of the plurality of inverters according to a phase shift pre-determined for that inverter.

In another embodiment, a control apparatus includes a control logic circuit that is configured to generate control signals for controlling at least two inverters (e.g., 3-phase inverters) that are coupled in parallel. The control logic circuit is configured to sample output currents present in common load terminals of the inverters, and to compare the sampled currents to generated current references. The output currents may be sampled, and/or the current references generated, at a fixed rate. Errors between the sampled currents and current references are evaluated against hysteresis dead bands around the current references. The control signals are generated based on (i) retrieved modulator output values for a selected one of the inverters and (ii) the errors as evaluated against the hysteresis dead bands. The control logic circuit may implement first and second counters for coordinating the current reference generation, sampling the output currents, retrieving the modulator output values, etc. The control apparatus may be further configured as shown and explained in FIGS. 4-5.

In another embodiment, a method for controlling multiple inverters connected in parallel includes, with a control apparatus (e.g., as shown in any of FIGS. 1-6), generating one or more sampled output currents of one or more output currents in one or more common load terminal of the inverters. The output currents are sampled at a fixed frequency. The method further includes comparing the one or more sampled output currents to one or more reference current values, and generating control signals for controlling semiconductor switches of the inverters based at least in part on the one or more sampled output currents as compared to the one or more reference current values. The method may further include generating the one or more reference current values at the fixed frequency.

In another embodiment, the method further includes, with the control apparatus, establishing a first counter, a second counter, a plurality of phase shift values, and a plurality of inverter select signals corresponding to the phase shift values. The sampled output currents and the one or more reference current values are generated based on counter outputs of the first counter and the second counter. The method further includes adjusting the control signals according to one of the phase shift values corresponding to one of the inverter select signals, and communicating the control signals that are adjusted to the switches of one of the inverters that is identified by said one of the inverter select signals.

Another embodiment provides a method for hysteresis current control of a plurality of inverters in a multi-inverter power converter. The method includes, at a pre-defined interval for each inverter of the plurality of inverters, setting a reference current based on desired output of the power converter; sampling current feedbacks; evaluating current errors and dead band crossings; evaluating an algorithm for setting switch commands; limiting switch commands according to minimum on/off and dead times; and commanding the switches of the inverter.

In some embodiments, a method is implemented in an FPGA that provides parallel paths for executing multiple calculations, with the FPGA concurrently for a plurality of inverters sampling current feedbacks, evaluating current errors and dead band crossings, and evaluating an algorithm for inverter switch commands. In other embodiments, a method is implemented in an FPGA that, sequentially for each of the plurality of inverters: establishes an algorithm for setting switch commands, sets a reference current, samples current feedbacks, evaluates current errors and dead band crossings, evaluates the established algorithm for setting switch commands, limits switch commands, and commands the switches.

In another embodiment, a method for controlling multiple inverters in parallel from a single control apparatus includes, in the control apparatus, establishing a primary counter and a secondary counter as well as a plurality of phase shift values and a plurality of inverter select signals corresponding to the phase shift values; sampling feedback currents and comparing the sampled feedback currents to reference currents; producing switch commands; adjusting the switch commands according to a phase shift value corresponding to an inverter select signal; and sending the switch commands to switches of an inverter identified by the inverter select signal. The method may further include sampling feedback currents only at pre-determined intervals based on the primary counter.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The terms "including" and "in which" are used as the plain-English equivalents of the respective terms "comprising" and "wherein." Moreover, the terms "first," "second," "third," "upper," "lower," "bottom," "top," etc. are used merely as labels, and are not intended to impose numerical or positional requirements on their objects.

This written description uses examples to disclose several embodiments of the invention, including the best mode, and also to enable one of ordinary skill in the art to practice the embodiments of invention, including making and using any devices or systems and performing any incorporated methods.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. A control apparatus comprising:
    a support structure;
    a control logic circuit attached to the support structure; and
    a control output terminal attached to the support structure;
    wherein the control logic circuit is configured to sense load terminal currents output by inverters connected in parallel to a common load via common load terminals, the control logic circuit configured to generate, for output through the control output terminal, control signals for controlling semiconductor switches of the inverters to adjust timing of a firing pattern at which a drive voltage is applied to one or more of the semiconductor switches to maintain the load terminal currents of the inverters at designated reference values; and
    wherein the support structure, including the control logic circuit and the control output terminal attached thereto, is removably detachable as a single unit from a machine frame to which the inverters are attached.

2. The apparatus of claim 1, wherein each of the inverters has an output power of at least 10 kW.

3. The apparatus of claim 1, wherein each of the inverters comprises a respective three-phase inverter and the common load terminals include three common load terminals with the inverters connected in parallel across a direct current bus and to the three common load terminals.

4. The apparatus of claim 1, wherein two or more of the semiconductor switches are silicon carbide (SiC) switches.

5. The apparatus of claim 1, wherein the control logic circuit comprises at least one of:
    one or more processors, or
    one or more field programmable gate arrays.

6. The apparatus of claim 1, wherein the support structure comprises a card that is removably detachable from a card slot of the machine frame disposed in a vehicle.

7. The apparatus of claim 1, wherein the control logic circuit is configured to repeatedly sample at least one of the load terminal currents output by at least one of the inverters; and
    wherein the control logic circuit is configured to adjust the timing of the firing pattern based on a comparison between the at least one of the load terminals currents that is sampled and at least one reference current value.

8. The apparatus of claim 7, wherein the control logic circuit is configured to repeatedly sample the at least one load terminal current at a fixed sample rate, and
    wherein the control logic circuit is configured to generate to repeatedly adjust the timing of the firing pattern at a fixed pattern that is based on the fixed sample rate.

9. The apparatus of claim 8, wherein the fixed sample rate is based on a counter output of the control logic circuit.

10. The apparatus of claim 1, wherein each of the inverters comprises a three-phase inverter, the inverters are connected in parallel across a direct current (DC) bus, and the common load terminal comprises three common load terminals.

11. The apparatus of claim 1, wherein the control logic circuit is configured to adjust the timing of the firing pattern based on whether a difference between at least one of the load terminal currents and a reference current value crosses a hysteresis dead band.

12. The apparatus of claim 11, wherein the control logic circuit is configured to adjust the timing of the firing pattern also based on one or more modulator output values that are retrieved based on a counter output of the control logic circuit.

13. A control apparatus comprising:
    a support structure;
    a control logic circuit attached to the support structure; and
    a control output terminal attached to the support structure;
    wherein the control logic circuit is configured to generate, for output through the control output terminal, control signals for controlling semiconductor switches of inverters that are coupled in parallel between a direct current bus and common load terminals connected with a common load;
    wherein the control logic circuit is configured to determine, based on a fixed sample rate, a terminal current that is output by at least one of the inverters to at least one of the common load terminals; and
    wherein the control logic circuit is configured to generate the control signals based at least in part on the terminal current and a reference current value, at least one of the control signals generated to adjusting timing at which a drive voltage is applied to at least one of the semiconductor switches.

14. The apparatus of claim 13, wherein each of the inverters comprises a three-phase inverter and the common load terminal include three common load terminals.

15. The apparatus of claim 13, wherein the fixed sample rate is based on a counter output of the control logic circuit.

16. The apparatus of claim 13, wherein the control logic circuit is configured to generate the control signals further based on whether a difference between the terminal current that is determined and the reference current value crosses one or more hysteresis dead bands.

17. The apparatus of claim 13, wherein:
the control logic circuit includes a first counter and a second counter that is driven by the first counter;
the control logic circuit is configured to determine the terminal current at the fixed sample rate that based on the second counter; and
the control logic circuit is configured to generate the reference current value based on an output of the first counter.

18. A method comprising:
determining, using control logic circuitry of a support structure also having a control output terminal, a terminal current that is output by at least one inverter of plural inverters that are coupled in parallel between a direct current bus and common load terminals connected with a common load, the terminal current determined based on a fixed sample rate;
comparing, using the control logic circuitry, the terminal current with a reference current value;
generating, using the control logic circuitry and for output through the control output terminal, a control signal based at least in part on the terminal current and a reference current value, at least one of the control signals generated to adjusting timing at which a drive voltage is applied to at least one of the semiconductor switches.

19. The method of claim 18, wherein the control signal also is generated based on whether a difference between the terminal current that is determined and the reference current value crosses one or more hysteresis dead bands.

20. The method of claim 19, the fixed sample rate is based on a first counter of the control logic circuitry that is driven by a second counter of the control logic circuitry, and further comprising:
determining the reference current value at times based on the second counter.

* * * * *